(12) United States Patent
Yang et al.

(10) Patent No.: US 11,914,873 B2
(45) Date of Patent: *Feb. 27, 2024

(54) FLASH MEMORY CONTROLLER

(71) Applicant: Silicon Motion, Inc., Hsinchu County (TW)

(72) Inventors: Tsung-Chieh Yang, Hsinchu (TW); Chun-Chieh Kuo, Taipei (TW); Ching-Hui Lin, Hsinchu County (TW); Yang-Chih Shen, Taoyuan (TW)

(73) Assignee: Silicon Motion, Inc., Hsinchu County (TW)

( * ) Notice: Subject to any disclaimer, the term of this patent is extended or adjusted under 35 U.S.C. 154(b) by 380 days.

This patent is subject to a terminal disclaimer.

(21) Appl. No.: 17/324,121

(22) Filed: May 19, 2021

(65) Prior Publication Data

US 2021/0271402 A1    Sep. 2, 2021

Related U.S. Application Data

(63) Continuation of application No. 17/030,392, filed on Sep. 24, 2020, now Pat. No. 11,048,421, which is a
(Continued)

(30) Foreign Application Priority Data

Aug. 19, 2011 (TW) .................. 100129676

(51) Int. Cl.
*G11C 7/00* (2006.01)
*G06F 3/06* (2006.01)
(Continued)

(52) U.S. Cl.
CPC ............ *G06F 3/0634* (2013.01); *G06F 3/064* (2013.01); *G06F 3/0604* (2013.01);
(Continued)

(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS

| 5,930,167 A | 7/1999 | Lee |
| 8,094,530 B2 | 1/2012 | Fuchiwaki |

(Continued)

FOREIGN PATENT DOCUMENTS

| JP | 2010-231228 | 10/2010 |
| TW | 201128389 A1 | 8/2011 |

*Primary Examiner* — Son T Dinh
(74) *Attorney, Agent, or Firm* — Winston Hsu

(57) ABSTRACT

A flash memory controller for controlling a flash memory module includes a communication interface for receiving a first data and a second data; and a processing circuit for dynamically controlling a data writing mode of the flash memory module according to an amount of stored data in the flash memory module. If the amount of stored data in the flash memory module is less than a first threshold when the communication interface receives the first data, the processing circuit controls the flash memory module so that the first data is written into the first data block under an one-bit-per-cell mode. If the amount of stored data in the flash memory module is greater than the first threshold when the communication interface receives the second data, the processing circuit controls the flash memory module so that the second data is written into the second data block under a two-bit-per-cell mode.

6 Claims, 5 Drawing Sheets

Related U.S. Application Data continuation of application No. 16/686,200, filed on Nov. 17, 2019, now Pat. No. 10,824,354, which is a continuation of application No. 16/260,142, filed on Jan. 29, 2019, now Pat. No. 10,521,142, which is a continuation of application No. 15/985,718, filed on May 22, 2018, now Pat. No. 10,235,075, which is a continuation of application No. 15/643,501, filed on Jul. 7, 2017, now Pat. No. 10,007,460, which is a continuation of application No. 15/235,128, filed on Aug. 12, 2016, now Pat. No. 9,733,857, which is a continuation of application No. 14/983,566, filed on Dec. 30, 2015, now Pat. No. 9,588,709, which is a continuation of application No. 14/596,236, filed on Jan. 14, 2015, now Pat. No. 9,256,529, which is a continuation of application No. 13/491,377, filed on Jun. 7, 2012, now Pat. No. 9,075,709.

(51) Int. Cl.
*G06F 12/02* (2006.01)
*G11C 11/56* (2006.01)

(52) U.S. Cl.
CPC ........ *G06F 3/0679* (2013.01); *G06F 12/0246* (2013.01); *G11C 11/5628* (2013.01); *G11C 11/5642* (2013.01); *G06F 2212/7201* (2013.01); *G06F 2212/7206* (2013.01); *Y02D 10/00* (2018.01)

(58) Field of Classification Search
USPC ....................................... 365/189.16, 185.18
See application file for complete search history.

(56) References Cited

U.S. PATENT DOCUMENTS

| | | | |
|---|---|---|---|
| 9,075,709 B2 | 7/2015 | Yang | |
| 9,256,529 B2 | 2/2016 | Yang | |
| 9,588,709 B2 | 3/2017 | Yang | |
| 9,733,857 B2 | 8/2017 | Yang | |
| 10,007,460 B2 | 6/2018 | Yang | |
| 10,235,075 B2 * | 3/2019 | Yang | ..................... G06F 3/0634 |
| 10,521,142 B2 | 12/2019 | Yang | |
| 10,824,354 B2 | 11/2020 | Yang | |
| 2006/0227645 A1 | 10/2006 | Honda | |
| 2008/0270682 A1 * | 10/2008 | Lasser | ................. G11C 11/5628 |
| | | | 711/E12.008 |
| 2010/0034021 A1 | 2/2010 | Joo | |
| 2010/0122016 A1 | 5/2010 | Marotta | |
| 2010/0169541 A1 | 7/2010 | Freikorn | |
| 2010/0246257 A1 | 9/2010 | Ito | |
| 2011/0176017 A1 | 7/2011 | Hamada | |
| 2011/0182119 A1 | 7/2011 | Strasser | |
| 2012/0014184 A1 | 1/2012 | Dutta | |
| 2012/0102379 A1 | 4/2012 | D'Abreu | |
| 2012/0173796 A1 | 7/2012 | Shen | |
| 2012/0210045 A1 | 8/2012 | Chang | |
| 2013/0051141 A1 | 2/2013 | Moschiano | |
| 2016/0110133 A1 | 4/2016 | Yang | |

* cited by examiner

FLASH MEMORY CONTROLLER

CROSS REFERENCE TO RELATED APPLICATIONS

This application is a Continuation of and claims the benefit of priority to U.S. patent application Ser. No. 17/030,392, filed on Sep. 24, 2020, which is a Continuation of U.S. patent application Ser. No. 16/686,200, filed on Nov. 17, 2019, which is a Continuation of U.S. patent application Ser. No. 16/260,142, filed on Jan. 29, 2019, which is a Continuation of U.S. patent application Ser. No. 15/985,718, filed on May 22, 2018, which is a Continuation of U.S. patent application Ser. No. 15/643,501, filed on Jul. 7, 2017, which is a Continuation of U.S. patent application Ser. No. 15/235,128, filed on Aug. 12, 2016, which is a Continuation of U.S. patent application Ser. No. 14/983,566, filed on Dec. 30, 2015, which is a Continuation of priority to U.S. patent application Ser. No. 14/596,236, filed on Jan. 14, 2015, which is a Continuation of priority to U.S. patent application Ser. No. 13/491,377, filed on Jun. 7, 2012; which claims the benefit of priority to Taiwanese Patent Application No. 100129676, filed on Aug. 19, 2011; the entirety of which is incorporated herein by reference for all purposes.

BACKGROUND OF THE INVENTION

1. Field of the Invention

The present disclosure generally relates to flash memory technology and, more particularly, to a flash memory controller capable of improving wear capacity and reliability of the flash memory module.

2. Description of the Prior Art

Flash memory is widely used in many applications, such as solid-state disks (SSD), memory cards, digital cameras, digital video recorders, multimedia players, mobile phones, computers, and many other electronic devices.

Flash memory may be realized by single-level cells (SLC), multi-level cells (MLC), triple-level cells (TLC), or even higher-level cells. Flash memory realized by the single-level cells has better performance in terms of accessing speed and reliability. Flash memory realized by the multi-level cells, triple-level cells, or even higher-level cells is capable of providing more storage capacity with lower cost, but has worse performance than the single-level cells in terms of endurance and wear capacity.

Due to the above nature, the traditional flash memory device is not able to provide high capacity with low cost while maintaining desirable wear capacity and reliability.

SUMMARY OF THE INVENTION

In view of the foregoing, it can be appreciated that a substantial need exists for apparatuses that can improve the wear capacity and reliability of a flash memory device realized by the multi-level cells, triple-level cells, or even higher-level cells.

An example embodiment of a flash memory controller for controlling a flash memory module is disclosed. The flash memory module comprises a read and write circuit, a first data block, and a second data block. The flash memory controller comprises: a communication interface for receiving a first data and a second data; and a processing circuit, coupled with the communication interface and the flash memory module, for dynamically controlling a data writing mode of the flash memory module according to an amount of stored data in the flash memory module; wherein if the amount of stored data in the flash memory module is less than a first threshold when the communication interface receives the first data, the processing circuit controls the flash memory module so that the first data is written into the first data block under an one-bit-per-cell mode, and if the amount of stored data in the flash memory module is greater than the first threshold when the communication interface receives the second data, the processing circuit controls the flash memory module so that the second data is written into the second data block under a two-bit-per-cell mode.

Another example embodiment of a flash memory controller for controlling a flash memory module is disclosed. The flash memory module comprises a read and write circuit, a first data block, and a second data block. The flash memory controller comprises: a communication interface for receiving a first data; and a processing circuit, coupled with the communication interface and the flash memory module, for dynamically controlling a data writing mode of the flash memory module according to an amount of stored data in the flash memory module; wherein if the amount of stored data in the flash memory module is less than a first threshold when the communication interface receives the first data, the processing circuit controls the flash memory module so that the first data is written into the first data block under an one-bit-per-cell mode, and afterwards the processing circuit controls the flash memory module so that at least one data stored in the first data block is rewritten into the second data block under a two-bit-per-cell mode.

Another example embodiment of a flash memory controller for controlling a flash memory module is disclosed. The flash memory module comprises a read and write circuit, a first data block, and a second data block. The flash memory controller comprises: a communication interface for receiving at least a first data; and a processing circuit, coupled with the communication interface and the flash memory module, for controlling the read and write circuit to write data into the flash memory module; wherein if an amount of stored data in the flash memory module is less than a first threshold when the communication interface receives the first data, the processing circuit controls the flash memory module so that a program threshold voltage of at least one cell in the first data block is configured to be within a first voltage range when writing the first data into the first data block.

Another example embodiment of a flash memory controller for controlling a flash memory module is disclosed. The flash memory module comprises a read and write circuit, a first data block, and a second data block. The flash memory controller comprises: a communication interface for receiving a first data; and a processing circuit, coupled with the communication interface and the flash memory module; wherein if an amount of stored data in the flash memory module is less than a first threshold when the communication interface receives the first data, the processing circuit controls the flash memory module so that a program threshold voltage of at least one cell in the first data block is configured to be within a first voltage range when writing the first data into the first data block, and afterwards the processing circuit controls the flash memory module so that a program threshold voltage of at least one cell in the second data block is configured to be within a third voltage range when writing at least one data stored in the first data block into the second data block, wherein the first voltage range is less than the third voltage range.

It is to be understood that both the foregoing general description and the following detailed description are example and explanatory only and are not restrictive of the invention, as claimed.

These and other objectives of the present invention will no doubt become obvious to those of ordinary skill in the art after reading the following detailed description of the preferred embodiment that is illustrated in the various figures and drawings.

DETAILED DESCRIPTION

Reference will now be made in detail to embodiments of the invention, which are illustrated in the accompanying drawings.

The same reference numbers may be used throughout the drawings to refer to the same or like parts or components/operations. Certain terms are used throughout the description and following claims to refer to particular components. As one skilled in the art will appreciate, a component may be referred by different names. This document does not intend to distinguish between components that differ in name but not in function. In the following description and in the claims, the term "comprise" is used in an open-ended fashion, and thus should be interpreted to mean "include, but not limited to . . . ". Also, the phrase "coupled with" is intended to compass any indirect or direct connection. Accordingly, if this document mentioned that a first device is coupled with a second device, it means that the first device may be directly or indirectly connected to the second device through electrical connections, wireless communications, optical communications, or other signal connections with/without other intermediate devices or connection means.

Figure 1:
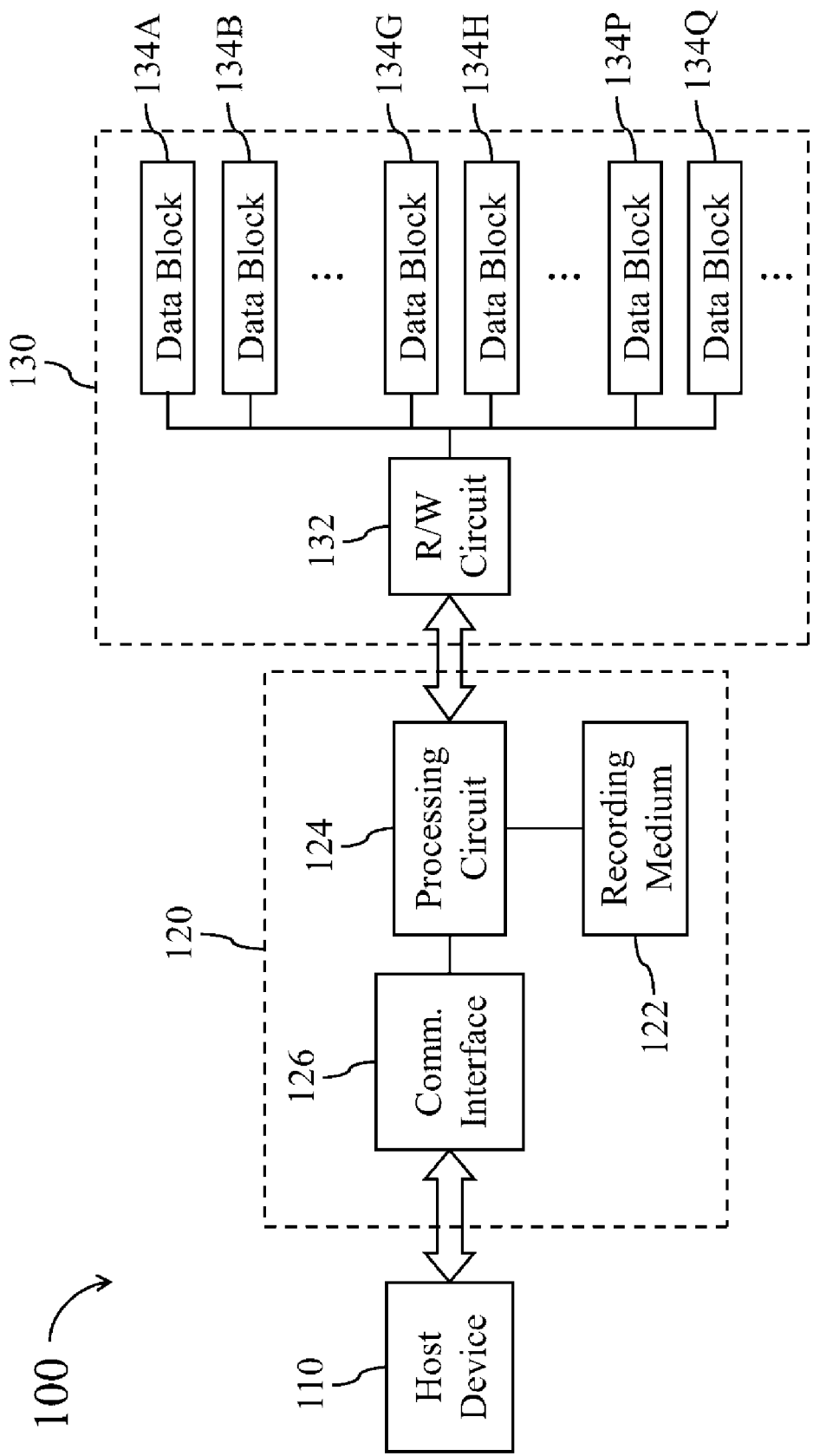
FIG. 1 is a simplified functional block diagram of a data storage system in accordance with an example embodiment.

FIG. 1 is a simplified functional block diagram of a data storage system 100 in accordance with an example embodiment. The data storage system 100 comprises a host device 110, a flash memory controller 120, and a flash memory module 130. The host device 110 accesses the flash memory module 130 through the flash memory controller 120. The host device 110 may be a computer, a card reader, a digital camera, a digital video recorder, a mobile phone, a GPS device, or any other electronic device capable of using the flash memory module 130 as a storage medium. The flash memory controller 120 comprises a recording medium 122, a processing circuit 124, and a communication interface 126. The communication interface 126 is utilized for coupling with the host device 110, so that data can be communicated between the processing circuit 124 and the host device 110 via the communication interface 126.

The flash memory module 130 comprises a read and write circuit 132 and a plurality of data blocks 134. In one embodiment, these data blocks 134 are realized by one or more TLC (triple-level cells) chips to provide high storage capacity with lower cost. The flash memory controller 120 and the flash memory module 130 may be integrated into a single memory device, such as a solid-state disk (SSD) or a memory card. The operations of writing data into the flash memory module 130 will be further described with reference to FIG. 2 and FIG. 3.

Figure 2:
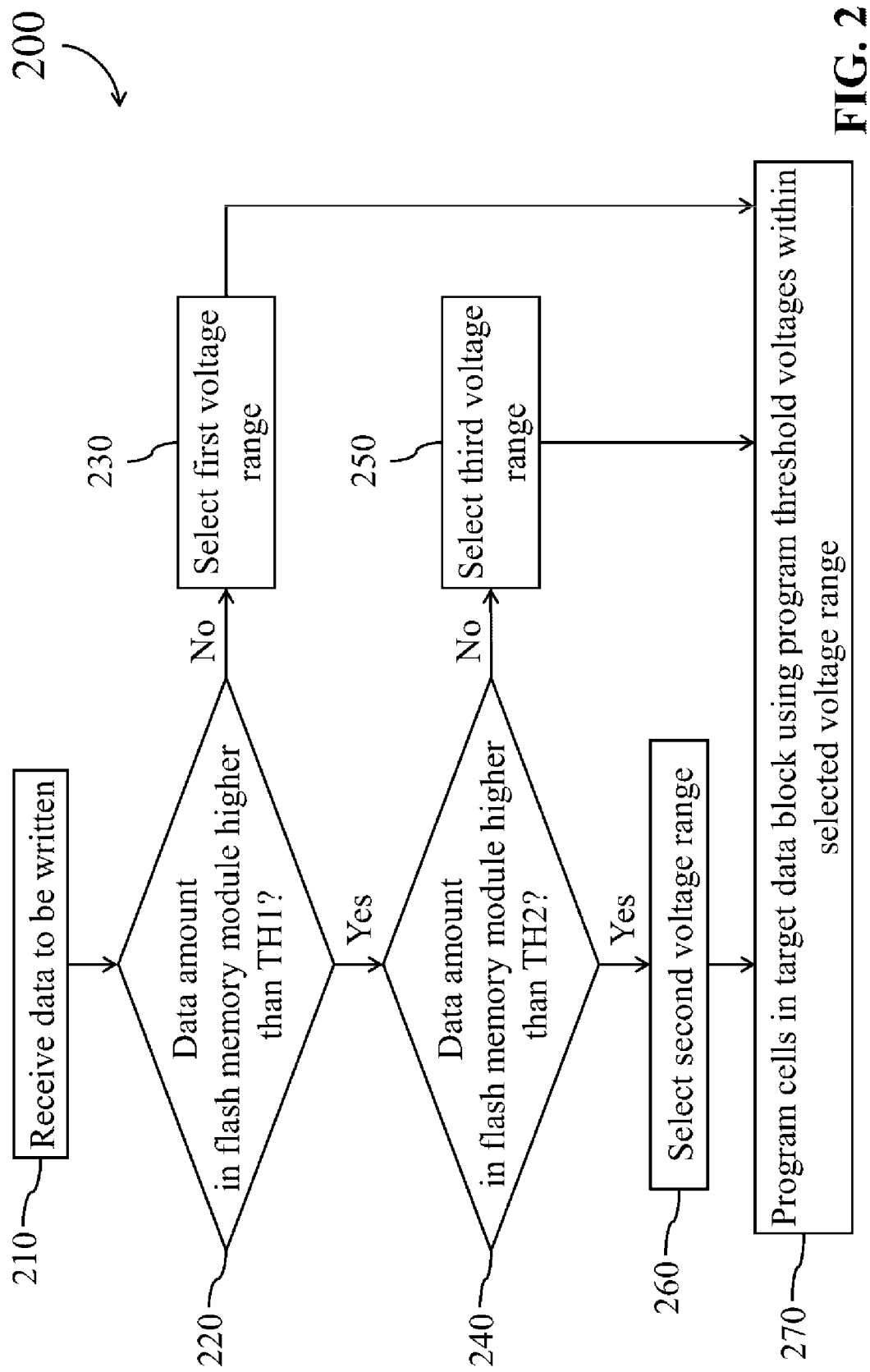
FIG. 2 is a simplified flowchart illustrating a method for writing data into flash memory in accordance with a first example embodiment.
Figure 3:
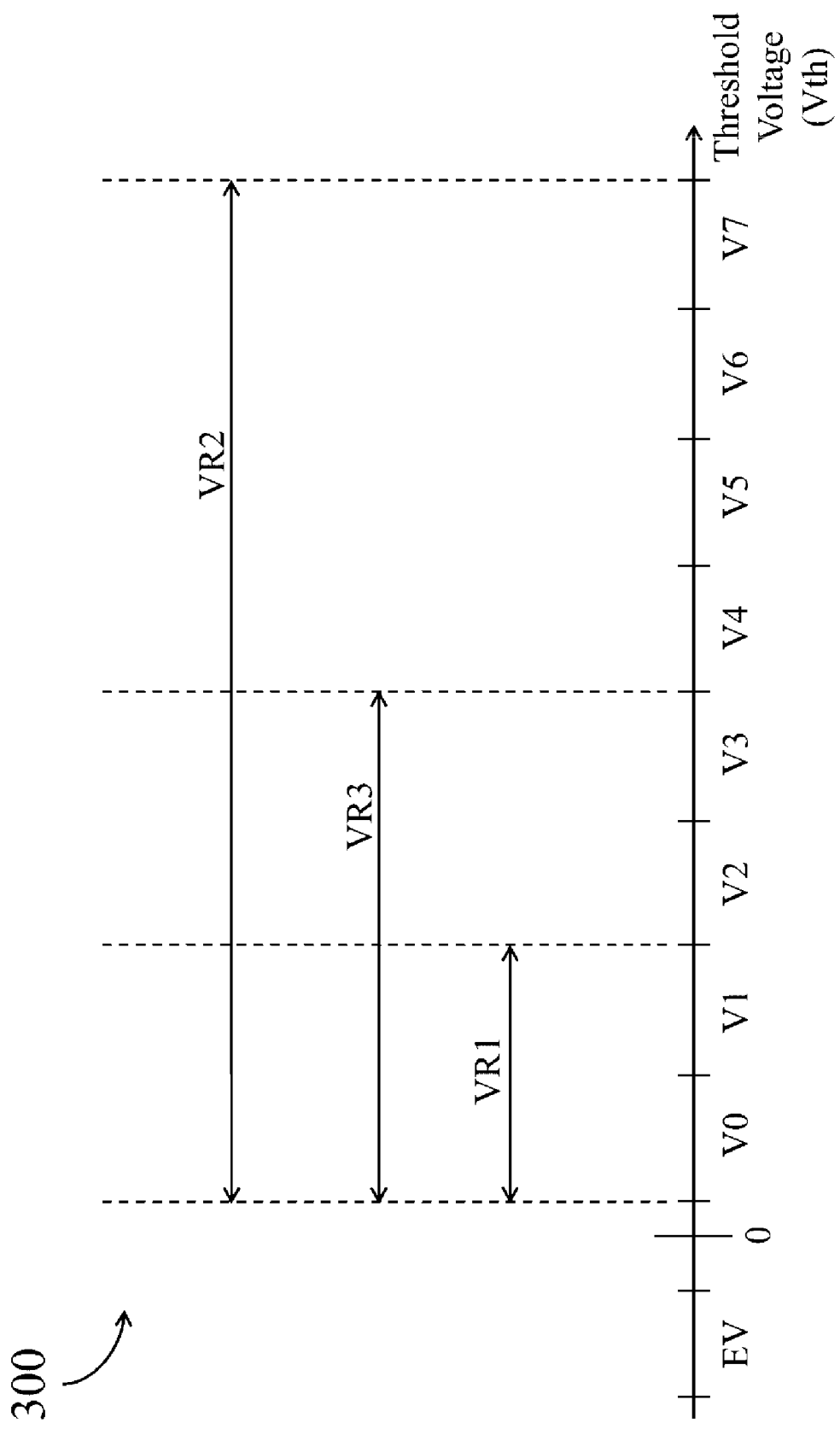
FIG. 3 is a simplified schematic diagram of program threshold voltages of cells in a data block of FIG. 1 according to an example embodiment.

FIG. 2 is a simplified flowchart 200 illustrating a method for writing data into flash memory in accordance with a first example embodiment. FIG. 3 is a simplified schematic diagram 300 of program threshold voltages of cells in the data block 134 of FIG. 1 according to an example embodiment.

In operation 210, the flash memory controller 120 receives data to be written transmitted from the host device 110 via the communication interface 126.

Then, the processing circuit 124 of the flash memory controller 120 decides a range of program threshold voltages for cells in a target data block for use to store the data according to an amount of stored data in the flash memory module 130.

For example, in the embodiment of FIG. 2, the processing circuit 124 performs operation 220 to determine whether the amount of stored data in the flash memory module 130 is higher than a first threshold TH1. If the amount of stored data in the flash memory module 130 is less than the first threshold TH1, the processing circuit 124 proceeds to operation 230. Otherwise, the processing circuit 124 proceeds to operation 240.

In operation 240, the processing circuit 124 further determines whether the amount of stored data in the flash memory module 130 is higher than a second threshold TH2, wherein TH2 is greater than TH1. If the amount of stored data in the flash memory module 130 is between the first threshold TH1 and the second threshold TH2, the processing circuit 124 proceeds to operation 250. If the amount of stored data in the flash memory module 130 is higher than the second threshold TH2, the processing circuit 124 proceeds to operation 260.

In implementations, the afore-mentioned first threshold TH1 and second threshold TH2 may be represented in the form of data amount, such as a certain number of MBs or GBs. Alternatively, the first threshold TH1 and the second threshold TH2 may be represented in the form of percentage values. For example, assuming that the nominal storage capacity of the flash memory module 130 is X GBs, the first threshold TH1 and the second threshold TH2 may be respectively set to be 0.3X GBs and 0.6X GBs, or may be respectively set to be 30% and 60% of the nominal storage capacity of the flash memory module 130.

As shown in FIG. 2, in the operation 230 the processing circuit 124 selects a first voltage range to be the voltage range of program threshold voltages for the target data block, in the operation 250 the processing circuit 124 selects a third voltage range to be the voltage range of program threshold voltages for the target data block, and in the operation 260 the processing circuit 124 selects a second voltage range to be the voltage range of program threshold voltages for the target data block.

The above first voltage range is less than 50% of the second voltage range, and the third voltage range is less than 60% of the second voltage range. The upper limit of the first voltage range may be less than 80% of the upper limit of the second voltage range. For example, the upper limit of the first voltage range may be less than 60% of the upper limit of the second voltage range, or even less than 30% of the upper limit of the second voltage range. The required power consumption for writing data into the cells of the data block can be reduced if the upper limit of the first voltage range is set to be lower. The upper limit of the third voltage range may be less than 80% of the upper limit of the second voltage range, or even less than 60% of the upper limit of the second voltage range. Similarly, the required power consumption for writing data into the cells of the data block can be reduced if the upper limit of the third voltage range is set to be lower.

In operation 270, the processing circuit 124 controls the read and write circuit 132 to program cells in a target data block 134 using program threshold voltages within the selected voltage range so as to write data into the target data block 134.

In the embodiment shown in FIG. 3, each cell of the data block 134 has an erase threshold voltage interval EV and a plurality of program threshold voltage intervals V0~V7. In implementations, the processing circuit 124 may select the first voltage range VR1 to be the voltage range of program threshold voltages for the target data block in the operation 230. The processing circuit 124 may select the third voltage range VR3 to be the voltage range of program threshold voltages for the target data block in the operation 250. The processing circuit 124 may select the second voltage range VR2 to be the voltage range of program threshold voltages for the target data block in the operation 260. In this embodiment, the upper limit of the first voltage range VR1 is less than 30% of the upper limit of the second voltage range VR2 and the first voltage range VR1 comprises the lowest two program threshold voltage intervals V0 and V1 within the second voltage range VR2. In addition, the upper limit of the third voltage range VR3 is less than 60% of the upper limit of the second voltage range VR2 and the third voltage range VR3 comprises the lowest four program threshold voltage intervals V0, V1, V2, and V3 within the second voltage range VR2.

For example, when the communication interface 126 receives a first data D1 to be written transmitted from the host device 110, if the amount of stored data in the flash memory module 130 at that time is less than the first threshold TH1, the processing circuit 124 may select the first voltage range VR1 to be the voltage range of program threshold voltage for a target data block, such as a first data block 134A, and control the read and write circuit 132 to program cells in the first data block 134A using program threshold voltages within the first voltage range VR1 so as to write the first data D1 into the first data block 134A under an one-bit-per-cell mode, a.k.a. 1bpc mode hereinafter.

Afterward, when the communication interface 126 receives a second data D2 to be written transmitted from the host device 110, if the amount of stored data in the flash memory module 130 at that time is between the first threshold TH1 and the second threshold TH2, the processing circuit 124 may select the third voltage range VR3 to be the voltage range of program threshold voltage for a target data block, such as a second data block 134G, and control the read and write circuit 132 to program cells in the second data block 134G using program threshold voltages within the third voltage range VR3 so as to write the second data D2 into the second data block 134G under a two-bit-per-cell mode, a.k.a. 2bpc mode hereinafter.

Afterward, when the communication interface 126 receives a third data D3 to be written transmitted from the host device 110, if the amount of stored data in the flash memory module 130 at that time is higher than the second threshold TH2, the processing circuit 124 may select the first voltage range VR2 to be the voltage range of program threshold voltage for a target data block, such as a third data block 134P, and control the read and write circuit 132 to program cells in the third data block 134P using program threshold voltages within the second voltage range VR2 so as to write the third data D3 into the third data block 134P under a three-bit-per-cell mode, a.k.a. 3bpc mode hereinafter.

In other words, different data blocks 134 of the flash memory module 130 may have different data storage modes at the same time. For example, in the previous embodiment, when the read and write circuit 132 just finished writing the third data D3 into the third data block 134P, the data storage mode of the third data block 134P is the 3bpc mode. At the same time, the data storage mode of the first data block 134A is the 1bpc mode and the data storage mode of the second data block 134G is the 2bpc mode.

In addition, when deciding the voltage range of program threshold voltages for a target data block, the processing circuit 124 may also take the property of the data to be written into consideration. For example, FIG. 4 shows a simplified flowchart 400 illustrating a method for writing data into flash memory in accordance with a second example embodiment, and FIG. 5 shows a simplified flowchart 500 illustrating a method for writing data into flash memory in accordance with a third example embodiment.

Figure 4:
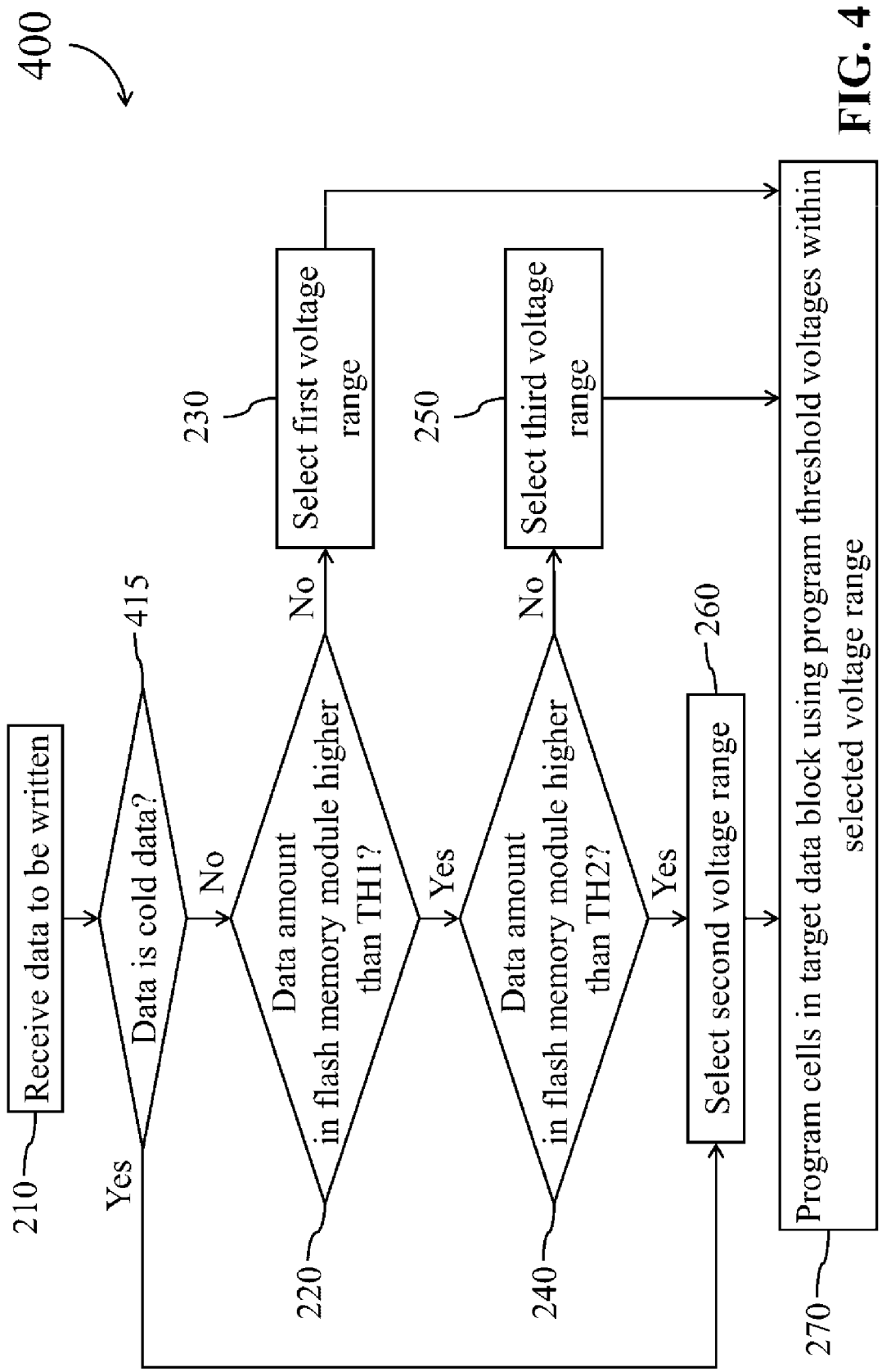
FIG. 4 is a simplified flowchart illustrating a method for writing data into flash memory in accordance with a second example embodiment.

In the embodiment shown in FIG. 4, when the communication interface 126 receives a fourth data D4 to be written transmitted from the host device 110, the processing circuit 124 firstly performs operation 415 to determine whether the fourth data D4 is cold data. The term "cold data" as used herein refers to a type of data that is expected will not be frequently accessed. The processing circuit 124 may determine whether the fourth data D4 is cold data or not according to the file type, file extension, logical address of the fourth data D4, or other criteria. If the processing circuit 124 determines that the fourth data D4 is cold data, the processing circuit 124 proceeds to the operation 260. Otherwise, the processing circuit 124 proceeds to the operation 220.

Figure 5:
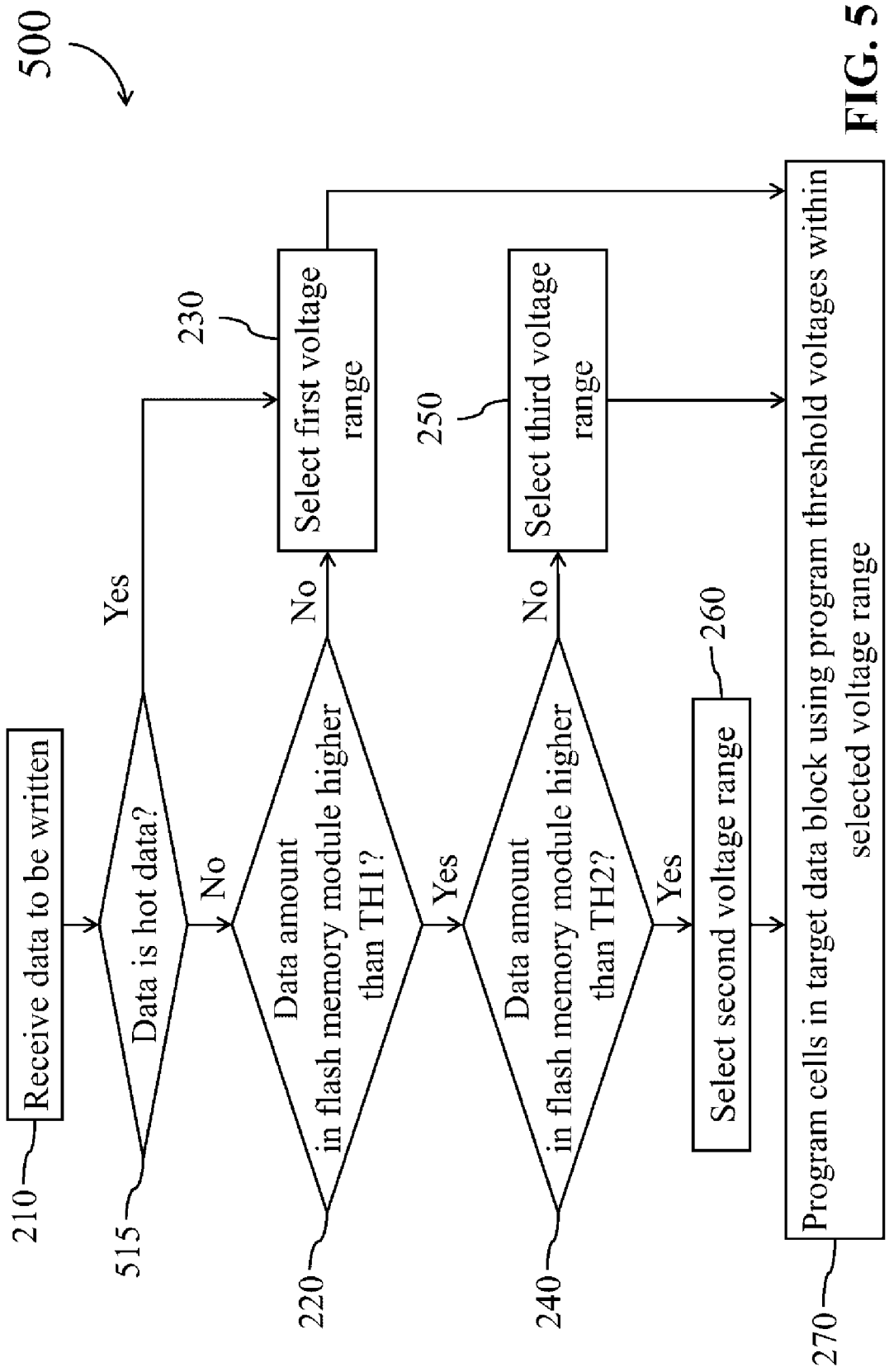
FIG. 5 is a simplified flowchart illustrating a method for writing data into flash memory in accordance with a third example embodiment.

In the embodiment shown in FIG. 5, when the communication interface 126 receives a fifth data D5 to be written transmitted from the host device 110, the processing circuit 124 firstly performs operation 515 to determine whether the fifth data D5 is hot data. The term "hot data" as used herein refers to a type of data that is expected will be frequently accessed. The processing circuit 124 may determine whether the fifth data D5 is hot data or not according to the file type, file extension, logical address of the fifth data D5, or other criteria. If the processing circuit 124 determines that the fifth data D5 is hot data, the processing circuit 124 proceeds to the operation 230. Otherwise, the processing circuit 124 proceeds to the operation 220.

In another embodiment, the processing circuit 124 may determine whether the fifth data D5 is cold data or hot data first. If the processing circuit 124 determines that the fifth data D5 is hot data, it proceeds to the operation 230; if the processing circuit 124 determines that the fifth data D5 is cold data, it proceeds to the operation 260; and if the processing circuit 124 determines that the fifth data D5 is not hot data nor cold data, it proceeds to the operation 220.

In operations, the processing circuit 124 may also record a number of times each data block 134 was written under the 1bpc mode, a number of times each data block 134 was written under the 2bpc mode, and/or a number of times each data block 134 was written under the 3bpc mode in the recording medium 122. For facilitating or simplifying the recording operation, the processing circuit 124 may record a number of times the data block 134 was erased under a particular mode, such as the 1bpc mode, the 2bpc mode, or the 3bpc mode, to be a representative value of the number of times the data block 134 was written under the particular mode. In the operation 270 described previously, the processing circuit 124 may select an appropriate data block 134 to be the target data block according to the information recorded in the recording medium 122, so that different data blocks can be evenly written under a particular mode to avoid overutilization of particular data blocks.

In addition, the processing circuit 124 may also record the usage situation of data blocks 134 of the flash memory module 130 in the recording medium 122, and decide whether to combine contents stored in some data blocks into a data block with sufficient storage capacity to release more data blocks for later usage.

For example, the processing circuit 124 may record an amount of data blocks in use within the flash memory module 130 in the recording medium 122, and combine contents stored in some data blocks into a data block having sufficient storage capacity when the amount of data blocks in use is higher than a third threshold TH3. Alternatively, the processing circuit 124 may record an amount of empty data blocks within the flash memory module 130 in the recording medium 122, and combine contents stored in some data blocks into a data block having sufficient storage capacity when the amount of empty data blocks is lower than a fourth threshold TH4.

When combining contents stored in different data blocks, the processing circuit 124 may control the read and write circuit 132 to write valid data stored in one or more candidate data blocks containing data written under the 1bpc mode, such as the data blocks 134A and 134B, into a target data block, such as the data block 134H or 134Q, under the 2bpc mode or 3bpc mode, and to erase the candidate data blocks. The processing circuit 124 may control the read and write circuit 132 to write valid data stored in one or more candidate data blocks containing data written under the 2bpc mode, such as the data blocks 134G and 134H, into a target data block, such as the data block 134P or 134Q, under the 3bpc mode, and to erase the candidate data blocks. The processing circuit 124 may control the read and write circuit 132 to write valid data stored in a first candidate data block containing data written under the 1bpc mode, such as the data block 134A or 134B, into a target data block, such as the data block 134P or 134Q, under the 3bpc mode, to write valid data stored in a second candidate data block containing data written under the 2bpc mode, such as the data block 134G or 134H, into the target data block, such as the data block 134P or 134Q, under the 3bpc mode, and to erase the first and second candidate data blocks.

Since the processing circuit 124 dynamically adjusts the voltage range of program threshold voltages for the target data block 134 to be written according to the amount of stored data in the flash memory module 130, the same data block 134 may be configured to have different program threshold voltage ranges at different points of time. For example, when the amount of stored data in the flash memory module 130 is less than the first threshold TH1, if the data block 134Q is selected as the target data block, then the processing circuit 124 may control the read and write circuit 132 to program cells in the target data block 134Q using program threshold voltages within the first voltage range VR1 so as to write data into the target data block 134Q under the 1bpc mode.

The data block 134Q may be erased due to various causes in the later operations. When the amount of stored data in the flash memory module 130 is increased to a level between the first threshold TH1 and the second threshold TH2, if the data block 134Q is again selected to be a target data block, the processing circuit 124 may control the read and write circuit 132 to program the cells in the target data block 134Q using program threshold voltages within the third voltage range VR3 so as to write new data into the target data block 134Q under the 2bpc mode.

Afterward, the data block 134Q may be again erased due to various causes in the later operations. When the amount of stored data in the flash memory module 130 is increased to a level higher than the second threshold TH2, if the data block 134Q is again selected to be a target data block, the processing circuit 124 may control the read and write circuit 132 to program the cells in the target data block 134Q using program threshold voltages within the second voltage range VR2 so as to write new data into the target data block 134Q under the 3bpc mode.

As described previously, the processing circuit 124 dynamically adjusts the voltage range of program threshold voltages for the target data block 134 to be written according to the amount of stored data in the flash memory module 130, or even directly assigns program threshold voltages to be used by the read and write circuit 132 when writing data into the target data block 134. When the amount of stored data in the flash memory module 130 reaches a lower level, the processing circuit 124 controls the read and write circuit 132 of the flash memory module 130 to program the data block 134 using lower program threshold voltages, such as threshold voltages within the voltage interval V0 or threshold voltages within the voltage interval V1 of FIG. 3. This not only reduces required power consumption for writing data into the data block, but also effectively improves the wear capacity of the cells of the flash memory module 130, thereby increasing the reliability of data stored in the flash memory module 130.

In addition, since the program threshold voltages of the data block 134 can be assigned by the processing circuit 124, the processing circuit 124 may also directly assign the read threshold voltage to be used by the read and write circuit 132 when reading data from the target data block 134, thereby increasing data reading speed of the flash memory module 130.

Thus, by using the above control method of the flash memory controller 120, the flash memory module 130 is allowed to provide high storage capacity with low cost when realized by the MLC chips, TLC chips, or even higher-level chips, and the endurance, wear capacity, and data reliability of the flash memory module 130 can also be effectively improved. Such architecture is beneficial not only for saving power consumption, but also for expediting the promotion and applications of solid-state disks.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller for controlling a flash memory module, wherein the flash memory module comprises a read and write circuit and a plurality of data blocks, the flash memory controller comprising:
   a communication interface for receiving data from a host device; and
   a processing circuit, coupled with the communication interface and the flash memory module, for receiving data from a host device;
   wherein the processing circuit determines if the data received from the host device is cold data or hot data; and if the processing circuit determines that the data is the cold data, the processing circuit uses a two-bit-per-cell mode or a three-bit-per-cell mode to write the data into a one of the data blocks; and if the processing circuit determines that the data is the hot data, the processing circuit uses a one-bit-per-cell mode to write the data into another one of the data blocks.

2. The flash memory controller of claim 1, wherein the plurality of data blocks are realized by triple-level cells (TLCs), and the blocks supports eight plurality of program threshold voltage intervals.

3. The flash memory controller of claim 1, wherein the processing circuit determines if the data is the cold data or the hot data according to a file type, a file extension, or a logical address of the data.

4. A data storage system, comprising:
   a flash memory module, wherein the flash memory module comprises a read and write circuit and a plurality of data blocks; and
   a flash memory controller, configured to access the flash memory module;
   wherein when the flash memory controller receives data from a host device, the flash memory controller determines if the data is cold data or hot data; and if the flash memory controller determines that the data is the cold data, the flash memory controller uses a two-bit-per-cell mode or a three-bit-per-cell mode to write the data into a one of the data blocks; and if the flash memory controller determines that the data is the hot data, the flash memory controller uses a one-bit-per-cell mode to write the data into another one of the data blocks.

5. The data storage system of claim 4, wherein the plurality of data blocks are realized by triple-level cells (TLCs), and the blocks supports eight plurality of program threshold voltage intervals.

6. The data storage system of claim 4, wherein the flash memory controller determines if the data is the cold data or the hot data according to a file type, a file extension, or a logical address of the data.

* * * * *